(12) United States Patent
Otremba

(10) Patent No.: US 7,291,869 B2
(45) Date of Patent: Nov. 6, 2007

(54) ELECTRONIC MODULE WITH STACKED SEMICONDUCTORS

(75) Inventor: Ralf Otremba, Kaufeuren (DE)

(73) Assignee: Infieon Technologies A.G., Munich (DE)

( * ) Notice: Subject to any disclaimer, the term of this patent is extended or adjusted under 35 U.S.C. 154(b) by 0 days.

(21) Appl. No.: 11/348,221

(22) Filed: Feb. 6, 2006

(65) Prior Publication Data

US 2007/0181908 A1     Aug. 9, 2007

(51) Int. Cl.
H01L 29/32      (2006.01)
H01L 29/74      (2006.01)
H01L 31/111     (2006.01)
H01L 23/02      (2006.01)
H03K 17/00      (2006.01)

(52) U.S. Cl. .................. 257/107; 257/686; 257/401; 257/288; 327/409

(58) Field of Classification Search ............... 257/107, 257/401, 341, 409, 288, 686; 327/409
See application file for complete search history.

(56) References Cited

U.S. PATENT DOCUMENTS

| | | | |
|---|---|---|---|
| 6,706,557 B2 | 3/2004 | Koopmans | 438/109 |
| 6,747,300 B2 | 6/2004 | Nadd et al. | 257/288 |
| 7,050,309 B2 * | 5/2006 | Farrington | 363/17 |
| 2002/0074637 A1 | 6/2002 | McFarland | 257/686 |
| 2002/0079566 A1 * | 6/2002 | Majid et al. | 257/685 |
| 2003/0165072 A1 | 9/2003 | Nadd et al. | 363/147 |
| 2004/0189229 A1 | 9/2004 | Nadd et al. | 318/434 |

FOREIGN PATENT DOCUMENTS

| | | |
|---|---|---|
| DE | 196 35 582 C1 | 2/1998 |
| DE | 199 35 100 A1 | 3/2001 |

OTHER PUBLICATIONS

Welch et al. (Jun. 2005). Transient Liquid Phase (TLP) Bonding for Microsystem Packaging Applications. Symposium conducted at the 13th International Conference on Solid-State Sensors, Acutators, and Microsystems, Seoul, Korea.*
Mohan, Ned. First Course on Power Electronics and Drives. Minneapolis: MNPERE, 2003.*

* cited by examiner

Primary Examiner—Jerome Jackson
Assistant Examiner—Michael Durbin
(74) Attorney, Agent, or Firm—Banner & Witcoff, Ltd.

(57) ABSTRACT

An electronic module has a heat sink with an upper surface and a lower surface, a plurality of leads arranged adjacent the heat sink and at least one circuit element with two vertical semiconductor power switches. The two vertical semiconductor power switches of each circuit element are arranged in a stack and are configured to provide a half-bridge circuit having a node defining an output. The first vertical semiconductor power switch of each of the circuit elements is mounted on the upper surface of the heat sink by an electrically conductive layer such that the lower surface of the heat sink provides the ground contact area of the electronic module.

24 Claims, 4 Drawing Sheets

ELECTRONIC MODULE WITH STACKED SEMICONDUCTORS

TECHNICAL FIELD

The invention relates to an electronic module comprising a plurality of semiconductor power switches and to a method of producing the electronic module.

BACKGROUND

Due into the increasing complexity of the current supply required by microprocessors in, for example, motherboards for computers and notebooks, multi-phase dc-dc buck converters are provided. A current of 2 to 20 amps can typically be provided by each phase of the buck converter. A buck converter typically comprises one or more half-bridge circuits, each provided by two power semiconductor power switches, such as power MOSFET devices, and further passive components, such as an inductance and a capacitance. The switching of the power MOSFET devices is controlled by a control semiconductor chip.

The components of the buck converter may be provided as individual components which are mounted on a printed circuit board. Alternatively, a number of components accommodated in a single housing to provide a multi-chip module, also referred to as a System-in-Package (SiP), which has the advantage that the assembly of the module on the board is simplified and the space required on the board can be reduced.

Due to the increasing demands for smaller components and higher power, insufficient heat dissipation from multi-chip modules may deleteriously affect the functionality of the module and/or neighboring components on the board. Improved heat dissipation from multi-chip modules is, therefore, becoming increasingly important.

SUMMARY

It would be desirable to provide an electronic module in which the heat can be more efficiently dissipated without increasing the size of the module.

An electronic module according to one aspect of the invention comprises a heat sink comprising an upper surface and a lower surface and a plurality of leads arranged adjacent the heat sink. The heat sink is also the die pad or chip carrier of the module. The lower surface of the heat sink provides an outer contact area of the electronic module. At least one control semiconductor chip is mounted on the upper surface of the heat sink.

The electronic module further comprises at least one circuit element. Each circuit element comprises two vertical semiconductor power switches which are arranged in a stack and configured to provide a half-bridge circuit. Each vertical semiconductor power switch comprises at least one anode, at least one cathode and at least one control electrode.

The anode of a second vertical semiconductor power switch is mounted on the cathode of a first vertical semiconductor power switch by a first electrically conductive layer to provide a stacked circuit element. The first electrically conductive layer provides a node defining an output of the half bridge circuit. The anode of the first vertical semiconductor power switch of each of the circuit elements is mounted on the upper surface of the heat sink by a second electrically conductive layer. The lower surface of the heat sink provides the ground contact area of the electronic module.

The control electrode of the first vertical semiconductor power switch and the control electrode of the second vertical semiconductor power switch of each circuit element are electrically connected to, and controllable by, the control semiconductor chips. The node is electrically connected to an output lead and the cathode of the second vertical semiconductor power switch is electrically connected to an input lead.

The lower surface of the heat sink according to the invention provides the ground contact of the module. Consequently, the electronic module according to the invention comprises a heat sink, on which the circuit elements are mounted, which lies at ground potential during normal operation.

The arrangement of the ground contact on the lower surface of the heat sink has the advantage that the lower surface of the heat sink of the electronic module may be mounted directly on an electrically conductive external heat sink.

In electronic modules in which the heat sink, on which the semiconductor power switches are mounted, is not the ground connection of the electronic module, additional electrical isolation is typically provided on the underside of the heat sink. This may be provided by the customer or user of the electronic module which is undesired since the module is more complicated to mount. Alternatively, the electrical isolation is provided by the manufacturer in the form of a fully encapsulated package housing in which the plastic encapsulation material providing the package housing also embeds the rear side of the heat sink. Both of these solutions have the disadvantage that the heat dissipation from the electronic module is reduced since the thermal path from the heat generating components to the environment is increased.

The electronic module according to the invention has the additional advantage that the control semiconductor chip or chips may be mounted on the heat sink by an electrically conductive layer, such as solder or an electrically conductive adhesive, since the heat sink provides the ground contact area of the electronic module and, therefore, lies at ground potential. The thermal conductivity of electrically conductive material tends to the superior to electrically insulating material. Consequently, the heat dissipation from the control semiconductor chip or chips into the heat sink can be simply and easily improved through the use of electrically conductive adhesive.

50% or more of the heat generated within an electronic module can be generated by the control semiconductor chip or chips, so that improvement of the heat flow from the control semiconductor chip or chips into the heat sink of the electronic module, and into the external heat sink, can further improve the functionality and reliability of the electronic module.

Since the heat dissipation from the electronic module is improved, the number of circuit elements included in the electronic module according to the invention may be increased to provide an electronic module of a particular size with additional functions while providing a similar, or improved, thermal performance.

The lower surfaces of the leads of the electronic module, at least in a region forming the outer contact area of the lead, lie in approximately the same plane as the lower surface of the heat sink. This enables the electronic module to be easily mounted onto a higher-level circuit such as a printed circuit board. The innermost portions of the leads positioned adjacent the heat sink are not in physical contact with the heat sink and are, therefore, physically separate and electrically isolated from the heat sink.

The leads may lie adjacent only one side of the heat sink, adjacent two opposing dies of the heat sink or adjacent all sides of the heat sink depending on the desired contact area or pin layout. The leads may lie in approximately the same plane as the heat sink. Alternatively, the innermost portion of the leads may lie in a plane above the upper surface of the heat sink and the outermost portion of the leads may extend outwards from the plastic housing of the module and downwards so that the lower surface of the outermost portion of the leads lies in approximately the same plane as the lower surface of the heat sink. The form, layout and number of leads or pins may be chosen as desired.

The invention has the advantage that standard packages which conform to agreed industry standards, such as JEDEC standards, may be used. This has the advantage that the electronic module may be used as a direct replacement for a package of the same type in which the lower surface of the heat sink does not provide the ground contact of the module.

According to the invention, the conductivity type (n-type or p-type) and the orientation of the first vertical semiconductor power switch and the conductivity type (n-type or p-type) and the orientation of the second vertical semiconductor power switch are configured so that a half-bridge circuit is provided and so that first vertical semiconductor power switch is the Low Side Switch of the half-bridge and such that the second vertical semiconductor power switch is the High Side Switch of the half-bridge circuit. This arrangement leads to the anode of the first semiconductor power switch being configured at ground potential during normal operation of the module.

An n-type semiconductor power switch comprises a semiconductor, for example silicon, with n-type conductivity. Similarly a p-type semiconductor switch comprises a semiconductor, for example silicon, with p-type conductivity.

In an n-type vertical semiconductor power switch, the anode is configured to lie at ground potential and provides the ground electrode and the cathode is configured to lie at a high potential. Conversely, in a p-type vertical semiconductor power switch, the anode is configured to lie at a high potential and the cathode is configured to lie at ground potential and provides the ground electrode.

The circuit element of the electronic module according to the invention may have different configurations of the first vertical semiconductor power switch and the second semiconductor power switch by which the ground electrode of the first vertical semiconductor power switch is mounted directly on the heat sink by an electrically conductive layer positioned between the ground electrode and the heat sink. Consequently, the lower surface of the heat sink provides the ground contact area of the electronic module.

In a first embodiment of the invention, the first vertical semiconductor power switch of each circuit element is a n-type semiconductor power switch which comprises a first surface comprising at least one anode and at least one control electrode and comprises a second surface comprising at least one cathode. A second vertical semiconductor power switch of each circuit element is a p-type semiconductor power switch having a first surface comprising at least one cathode and at least one control electrode and having a second surface comprising at least one anode.

The ground electrode of the second vertical semiconductor power switch is, therefore, mounted on the high potential electrode of the first vertical semiconductor power switch forming a node providing an output from the half-bridge circuit. The ground electrode of the first semiconductor power switch, therefore, is mounted on the heat sink and both the anode and the heat sink are configured at ground potential.

Therefore, the stack providing the circuit element has a half-bridge configuration in which the first vertical semiconductor power switch is the Low Side Switch and the second vertical semiconductor power switch is the High Side Switch. The anode of the first vertical semiconductor power switch is mounted on, and electrically connected to, the heat sink. The lower surface of the heat sink, therefore, provides ground contact area of the electronic module according to the invention.

In this embodiment of the invention, the control electrode of the first vertical semiconductor power switch is positioned or on the same surface as the anode and, therefore, faces downwards towards the lower surface of the module. The control electrode of the first vertical semiconductor power switch may be mounted on a lead by a third electrically conductive layer. The first vertical semiconductor power switch, therefore, extends between the heat sink and at least one lead of the electronic module.

This arrangement has the advantage that the electrical connections to the first surface of the first vertical semiconductor power switch are electrically isolated from each other since the heat sink and lead are not physically or electrically connected. Since the control electrode of the first vertical semiconductor power switch is supported on the lead and electrically connected to the lead, the control electrode may be electrically accessed via the lead by additional electrical connections such as bond wires within the electronic module. Therefore, the control electrode of the first vertical semiconductor power switch can be simply controlled by the control semiconductor chip or chips by an electrical connection extending from the control semiconductor chip or chips to the lead. The lead and electrical connection provides a three-dimensional rewiring structure.

In an alternative embodiment of the invention, the first vertical semiconductor power switch is a n-type semiconductor power switch having a first surface comprising at least one anode and at least one control electrode and having a second surface comprising at least one cathode and the second vertical semiconductor power switch is a n-type semiconductor power switch having a first surface comprising at least one anode and at least one control electrode and having a second surface comprising at least one cathode.

The ground electrode of the second vertical semiconductor power switch is, therefore, mounted on the high potential cathode electrode of the first vertical semiconductor power switch forming a node providing an output from the half-bridge circuit. The ground electrode of the first semiconductor power switch, therefore, is mounted on the heat sink and both the anode and the heat sink are configured at ground potential.

In this embodiment of the invention in which both the first and second vertical semiconductor switches have n-type conductivity, each circuit element may further comprise a rewiring structure which may have the from of a rewiring layer or interposer. The rewiring structure is disposed between, and electrically connects, the cathode of the first vertical semiconductor power switch and the anode of the second vertical semiconductor power switch. The control electrode of the second vertical semiconductor power switch is electrically isolated from the first vertical semiconductor power switch.

The rewiring structure may be provided in the form of a foil or tape which comprises an electrically insulating layer with a lower surface which is mounted on the second surface of the first semiconductor switch and an upper surface which is mounted on the first surface of the second semiconductor switch. The foil or tape, which provides the rewiring structure, may comprise electrically conductive through contacts which are positioned in the region between, and electrically connect, the cathode of the first vertical semiconductor power switch and the anode of the second vertical semiconductor power switch. The electrically insulating layer of the tape provides the electrical isolation of the control electrode of the second vertical semiconductor power switch. The upper surface of the electrically insulating layer may further comprise electrically conductive conductor tracks which extend from the control electrode of the second vertical semiconductor power switch to the periphery of the tape. Additional electrical connections, such as bond wires may be made to the outer peripheral region of the conductor tracks and, therefore, enable the control electrode to be electrically accessed by, example, the semiconductor control chip or chips.

In a further alternative embodiment of the invention, the first vertical semiconductor power switch is a p-type semiconductor power switch having a first surface comprising at least one cathode and at least one control electrode and having a second surface comprising at least one anode and the second vertical semiconductor power switch is a p-type semiconductor power switch having a first surface comprising at least one cathode and at least one control electrode and having a second surface comprising at least one anode.

The anode of the first vertical semiconductor power switch is mounted directly on the heat sink and the anode of the second vertical semiconductor power switch is mounted on the cathode of the first semiconductor power switch.

Also in this arrangement, the ground electrode of the second vertical semiconductor power switch is, therefore, mounted on the high potential electrode of the first vertical semiconductor power switch forming a node providing an output from the half-bridge circuit. The ground electrode of the first semiconductor power switch, therefore, is mounted on the heat sink and both the anode and the heat sink are configured at ground potential.

For each of the embodiments of the circuit element of the invention, the first vertical semiconductor power switch may be one of a MOSFET (Metal Oxide Semiconductor Field Effect Transistor) and a IGBT (Isolated Gate Bipolar Transistor) and the second vertical semiconductor power switch may be one of a MOSFET and a IGBT. In the case of a MOSFET device, the anode is conventionally denoted as the source, the cathode as the drain and the control electrode as the gate. In the case of an IGBT device, the anode is conventionally denoted as the emitter, the cathode as the collector and the control electrode as the gate. Typically, each circuit element includes two MOSFET devices or two IGBT devices.

In a further embodiment of the invention, the electronic module according to one of the previous embodiments comprises two control semiconductor chips. A first semiconductor control chip is a control electrode driver and the second semiconductor control chip is a pulse width modulator (PWM) chip.

The two semiconductor control chips may each be mounted on the heat sink adjacent one another. This arrangement has the advantage that heat is dissipated from each chip more directly into the heat sink. Alternatively, the control electrode driver chip may be mounted on the pulse wave modulator chip and the pulse wave modulator chip is mounted on the heat sink to form a stack. This arrangement has the advantage that the space occupied by the control chips on the heat sink is reduced and that the length of the electrical connections between the two control chips is reduced.

The electronic module according to the invention, may comprise at least two circuit elements each of which are mounted directly on the heat sink and arranged at substantially the same distance from the control semiconductor chip. This arrangement results in the electrical connections from the circuit element to the control chip being approximately the same length for each circuit element. This improves the electrical performance of the electronic module.

In a further embodiment of the invention, the at least two circuit elements are arranged symmetrically around the control semiconductor chip. At least two circuit elements are arranged symmetrically around an axis normal to the upper active surface of the control chip and, therefore, equidistant from each other around this axis. This further equalizes the length of the electrical connections and equalizes the position of the heat generating regions over the heat sink. This improves the overall thermal performance of the electronic module.

The electronic module may be configured as dc-dc buck converter and may be configured as a multi-phase dc-dc buck converter where the number of phases equals the number of circuit elements provided in the electronic module. The electronic module may include four circuit elements, each providing a half-bridge configuration to provide four-phase dc-dc buck converter.

The first electrically conductive layer may comprise a diffusion solder bond, the second electrically conductive layer may comprise a diffusion solder bond and the third electrically conductive layer may comprise a diffusion solder bond.

The phrase "diffusion solder bond" is used in this context to denote a connection structure which is mechanically and electrically attached to a surface by a layer comprising intermetallic phases. The intermetallic phases are located at the interface between the connection structure and the surface. The intermetallic phases are formed as a result of a diffusion soldering process and comprise chemical elements of the diffusion solder and of at least one contiguous material, for example the heat sink or lead.

A diffusion solder bond has the advantage that the melting point of the intermetallic phases is higher than the melting point of the diffusion solder itself. Consequently, the bond which is formed as a result of the diffusions process has a melt temperature which is higher than the temperature at which the bond is formed. A diffusion solder bond, therefore, has the advantage that a second semiconductor component may be mounted on the die pad in a second diffusion bonding step without the diffusion solder bond connecting the first semiconductor component to the die pad melting. Consequently, the problems associated with soft solder bonding, in particular, movement of the semiconductor components during subsequent die attach steps, are avoided. Diffusion solder bonding is, therefore, particularly advantageous for multi-chip modules in which two or more chips or semiconductor components are mounted adjacent to one another directly on the die pad or for multi-chip modules in which two components are stacked one on top of the other.

Diffusion solder bonds are typically thinner than soft solder bonds. Diffusion solder bonds are typically less than 10 µm in thickness whereas soft solder bonds typically have a thickness of around 100 µm. The smaller thickness of the diffusion solder bond has the advantage that the thermal dissipation from the semiconductor component into the die pad is improved and the thermal performance of the package is improved.

A diffusion solder bond has the further advantage that the lateral area occupied by the bond substantially corresponds to the lateral area of the semiconductor component. In contrast to soft solder joints, the structure for producing the diffusion solder bond, is fabricated by depositing the structure on the semiconductor component.

In a first embodiment, the diffusion solder bond comprises a contact layer diffusion barrier layer disposed on the contact layer, and a diffusion solder layer disposed on the diffusion barrier layer. The anode may provide the contact layer of the anode may comprise the diffusion solder bond.

The contact layer consists essentially of aluminium and the diffusion barrier layer comprises one of the group of consisting of Ti metal and a first layer of consisting essentially of Ti metal and a second layer comprising $TiN_x$. diffusion solder bond comprises an alloy, the alloy comprising Sn and one of the group consisting of Ag, Au, Cu and In. The alloy comprises intermetallic phases.

The electrically conductive layer may have a thickness t where $0.1\ \mu m \leq t \leq 100\ \mu m$, preferably $0.1\ \mu m \leq t \leq 10\ \mu m$, more preferably $1.5\ \mu m \leq t \leq 3.5\ \mu m$.

The contact layer may have a thickness a, where $0.01\ \mu m \leq a \leq 10\ \mu m$, preferably $0.1\ \mu m \leq a \leq 1\ \mu m$. The diffusion barrier layer may have a thickness b, where $0.1\ \mu m \leq b \leq 10\ \mu m$, preferably $0.1\ \mu m \leq b \leq 1\ \mu m$. The diffusion solder layer may have a thickness c, where $0.1\ \mu m \leq c \leq 80\ \mu m$, preferably $0.5\ \mu m \leq c \leq 5\ \mu m$.

In an alternative embodiment, the diffusion solder bond comprises a contact layer and a diffusion solder layer. The contact layer comprises one of a metal and an alloy thereof, the metal being one of the group of elements consisting of Ti, Ni and Cr, and the diffusion solder layer comprises an alloy, the alloy comprising Sn and one of the group consisting of Ag, Au, Cu and In.

In a further development of the previous embodiment of the invention, at least one further layer is disposed between the contact layer and the diffusion solder layer. The further layer comprises one of a metal and an alloy thereof, the metal being one of the group of elements Ni, Au, Ag, Pt and Pd.

The invention also relates to methods of assembling electronic modules. A method according to the invention comprises providing a heat sink comprising an upper surface and a lower surface, wherein the lower surface provides an outer contact area of the electronic module. A plurality of leads arranged adjacent the heat sink are also provided. At least two vertical semiconductor power switches are provided, each having at least one cathode, at least one anode and at least one control electrode. The anode of at least one first vertical semiconductor power switch is attached to the upper surface of the heat sink by a second electrically conductive layer. The cathode of a second vertical semiconductor power switch is attached to each of the first vertical semiconductor power switches by a first electrically conductive layer to provide a circuit element having a half-bridge configuration and to provide a node providing an output. The lower surface of the heat sink provides the ground contact area of the electronic module.

In a method according to the invention, the stack of two vertical semiconductor power switches providing each circuit element is produced by assembling the stack on the heat sink. The anode of a first vertical semiconductor power switch is mounted on the upper surface of the heat sink and electrically connected to the upper surface of the heat sink by an electrically conductive layer, which, for consistency with the previous description, is denoted as the second electrically conductive layer. The anode of the second vertical semiconductor switch is then attached to the cathode of the first vertical semiconductor switch by the first electrically conductive layer. This electrically conductive connection between the anode of the second vertical semiconductor switch and the cathode of the first vertical semiconductor switch provides a node which provides an output from the half bridge circuit provided by the circuit element.

In a first embodiment of the method according to the invention, the anode of one of a selected number of first vertical semiconductor power switches is attached to the upper surface of the heat sink in a process step and the process step repeated the selected number of times and the cathode of one of a selected number of second vertical semiconductor power switches is attached to the first vertical semiconductor switches in a further process step and the further process step is repeated the selected number of times. The selected number of first vertical semiconductor power switches and second vertical semiconductor power switches is the same.

For example, if four circuit elements are to be provided in the electronic module, a process step is carried out for each individual first vertical semiconductor power switch in order to mount the four first vertical semiconductor power switches on the heat sink. Four process steps are, therefore, carried out sequentially. A further four process steps are carried out, during which a second vertical semiconductor power switch is mounted on, and electrically connected to, a first semiconductor power switch in each process.

In an alternative method according to the invention, the anode of each of a selected number of first vertical semiconductor power switches are attached to the upper surface of the heat sink in a first process step, essentially simultaneously, and the cathode of each of a selected number of second vertical semiconductor power switches is attached to each of the first vertical semiconductor switches, essentially simultaneously, in a second process step.

The method according to one of the embodiments already described may also comprise the following further method steps. The node of each circuit element is electrically connected to an output lead and the cathode of the second vertical semiconductor power switch of each circuit element is electrically connected to an input lead. At least the circuit elements and electrical connections are encapsulated in plastic encapsulation compound leaving the lower surface of the heat sink free from the plastic encapsulation compound. The electrical connections may be provided by bond wires.

In further methods steps, at least one control semiconductor chip may be attached to the upper surface of the heat sink. In this case, electrical connections are produced between the control electrode of the first vertical semiconductor power switch and the control semiconductor chip and between the control electrode of the second vertical semiconductor power switch and the control semiconductor chip for each circuit element.

In an embodiment of the method according to the invention, the electrical connections are provided to the first vertical semiconductor power switch before the second vertical semiconductor power switch is mounted on the first vertical semiconductor power switch. This has the advantage that more free space is available for the movement of the tool with which the connections are produced, for example a wire bonding tool in the case of bond wire connections.

Alternatively, the electrical connections are provided to the first vertical semiconductor power switch after the second vertical semiconductor power switch is mounted on the first vertical semiconductor power switch. This method has the advantage that the electrical connection to the first and semiconductor power switch may be made in a single manufacturing stage. This simplifies the assembly line and/or transfer of the module within the assembly line.

The outer surface of the anode of the first vertical semiconductor power switch and the outer surface of the anode of the second vertical semiconductor power switch may comprise a diffusion solder layer. A diffusion solder layer is one which comprises a diffusion solder which during a diffusion solder process, melts and forms solid intermetallic phases with the elements of the adjoining materials.

This diffusion solder layer can be simply provided by vacuum deposition or galvanic deposition of a layer of diffusion solder onto the anode of the first semiconductor power switch and anode of the second semiconductor power switch. Alternatively the diffusion solder layer may be deposited on the outer surface of the anode and cathode of the first semiconductor power switch.

The anode of each of a selected number of first vertical semiconductor power switches is attached to the upper surface of the heat sink by a diffusion solder process forming a diffusion solder bond and the anode of the second vertical semiconductor is attached to the cathode of each of the first vertical semiconductor switches by a diffusion solder process forming a diffusion solder bond.

During the diffusion solder process, intermetallic phases form at the interface between the diffusion solder layer and the adjoining surface. The diffusion solder process may be carried out until all of the diffusion solder has been transformed into intermetallic phases.

The first vertical semiconductor power switch may be attached to the upper surface of the heat sink, by heating the heat sink in a temperature above the melting point of the diffusion solder and then pressing the anode of the first semiconductor power switch onto the upper surface of the heat sink.

In a further embodiment of the invention, a diffusion barrier layer is deposited on the anode of the first and of the second vertical semiconductor power switches and a diffusion solder layer is then deposited on the diffusion barrier layer. The anode of the first and second vertical semiconductor power switches is a contact layer. The diffusion solder bond produced, therefore, consists of three layers, a contact layer, a diffusion barrier layer and a diffusion solder bond layer comprising intermetallic phases. The diffusion barrier layer prevents a reaction between the material of the anode or contact layer and the diffusion solder.

In an embodiment of the invention, the contact layer consists essentially of aluminium and wherein the diffusion barrier layer comprises one of the group of consisting of Ti metal and a first layer of consisting essentially of Ti metal and a second layer comprising $TiN_x$ and wherein the diffusion solder layer comprises an alloy, the alloy comprising Sn and one of the group consisting of Ag, Au, Cu and In.

In an alternative embodiment of the diffusion solder bond, the contact layer or anode of the first and second semiconductor power switches comprises one of a metal and an alloy thereof, the metal being one of the group of elements consisting of Ti, Ni and Cr. The diffusion solder layer comprises an alloy, the alloy comprising Sn and one of the group consisting of Ag, Au, Cu and In and is positioned directly on the contact layer.

In a further embodiment, at least one further layer is disposed between the contact layer and the diffusion solder layer. The further layer comprises one of a metal and an alloy thereof, the metal being one of the group of elements Ni, Au, Ag, Pt and Pd.

The structure which provides the diffusion bond of the first, second and third electrically conductive layers may be essentially identical for each bond of an electronic module. As previously described, the diffusion solder bond has the advantage that the melting point of the intermetallic phases produced in the bond is higher than the melting point of the diffusion solder itself. Therefore, the formed diffusion solder bond is mechanically stable during subsequent diffusion solder bonding processes.

However, different diffusion solders may be used within a single electronic module. In the case where the control electrode of the first semiconductor power switch is mounted on the lead by a diffusion solder bond, it is advantageous that the diffusion solder bond is essentially identical to that between the anode of the first semiconductor power switch and the heat sink since both bonds are simply formed in the same process step.

The diffusion solder bond between the cathode of first semiconductor power switch and the anode of the second semiconductor power switch may have a different structure to that positioned on the anode of the first semiconductor power switch and, in particular, the diffusion solder of the diffusion solder layer may have a different melting point. In particular, it is advantageous that the melting point of the diffusion solder which produces the joint between the two semiconductor power switches of a circuit element has a lower melting point as this reduces possible damage to the two semiconductor power switches caused by high processing temperatures.

The invention also relates to electronic modules which include at least one circuit element, each comprising two vertical semiconductor power switches in a half-bridge arrangement, and a heat sink whose lower surface provide the ground contact of the electronic module. The electronic module does not necessarily include one or more semiconductor control chips arranged within the electronic module.

In this embodiment of the invention, an electronic module, comprises a heat sink comprising an upper surface and a lower surface and a plurality of leads arranged adjacent the heat sink. The lower surface of the heat sink provides an outer contact area of the electronic module.

The electronic module further comprises at least one circuit element. Each circuit element comprises two vertical semiconductor power switches, each vertical semiconductor power switch comprising at least one anode, at least one control electrode and at least one cathode. The two vertical semiconductor power switches of each circuit element are arranged in a stack and configured to provide a half-bridge circuit having a node defining an output.

The anode of the first vertical semiconductor power switch of each of the circuit elements is mounted on the upper surface of the heat sink by a second electrically conductive layer and the lower surface of the heat sink provides the ground contact area of the electronic module.

In a further refinement of this embodiment of the invention, the conductivity type and orientation of the first vertical semiconductor power switch and the conductivity type and orientation of the second vertical semiconductor power switch of each circuit element is configured such that a half-bridge circuit configuration is provided in which the first vertical semiconductor power switch is the Low Side Switch and the second vertical semiconductor power switch is the High Side Switch of the half-bridge circuit.

Further electrical connections may be provided so that the node is electrically connected to an output lead and the cathode of the second vertical semiconductor power switch is electrically connected to an input lead of the electronic module.

In summary, since the heat dissipation from the electronic module is improved, the number of circuit elements included in the electronic module according to the invention may be increased to provide an electronic module of a particular size with additional functions while providing a similar, or improved, thermal performance. For example, the number of phases which may be switched by a dc-dc buck converter provided in an electronic module of a particular size may be increased by configuring the vertical semiconductor power switches which provide the half-bridge circuits such that the heat sink lies at ground potential and the lower surface of the heat sink provides the ground contact area of the electronic module.

In the description, "upper" and "lower" are used to define the side of the semiconductor components in relation to the heat sink of the component and in relation to the orientation of the electronic module in relation to an external board on which the electronic module is mounted. "lower" refers to the side which faces towards the heat sink and external board and "upper" refers to the side which faces away from the heat sink and external board.

DETAILED DESCRIPTION

Figure 1:
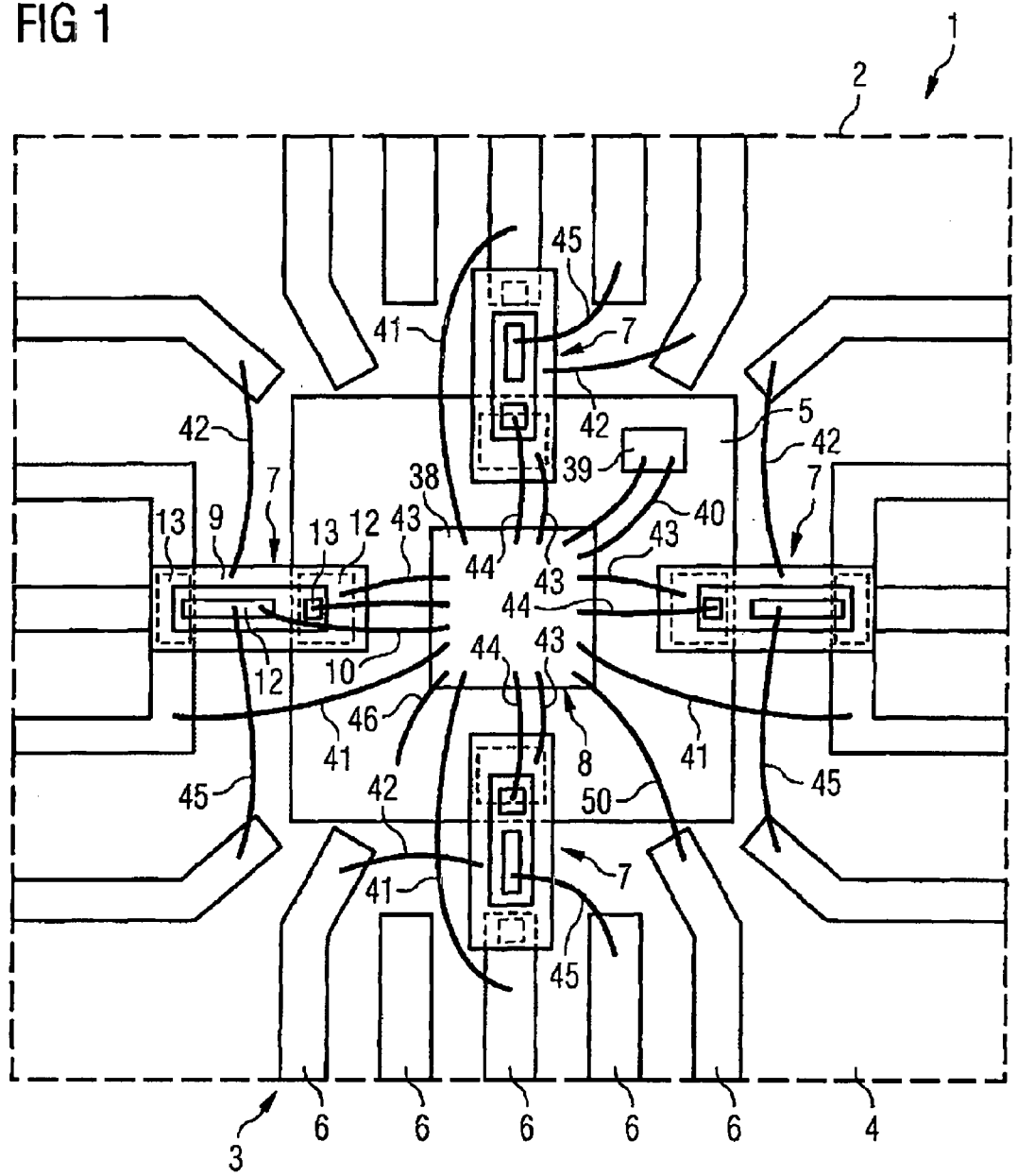
FIG. 1 illustrates a top view of an electronic module including four half-bridges according to a first embodiment of the invention.

FIG. 1 shows a top view of an electronic module 1 according to a first embodiment of the invention. The electronic module 1 comprises a VQFN (Very thin Quad Flat Non-leaded) package 2 which comprises a leadframe 3 and an epoxy plastic encapsulation 4 which provides the plastic housing of the module 1. The leadframe 3 comprises a die pad 5 which is substantially laterally square and is disposed in the lateral centre of the leadframe 3. The leadframe 3 also comprises a plurality of leads 6 which are positioned adjacent each of the four sides of the die pad 5 and extend in directions essentially perpendicular to the side of the die pad 5 to which they are adjacent. The leads 6 are, in this embodiment, not physically connected to the die pad 5. The die pad 5 provides the heat sink of the electronic module 1. The leadframe 3 consists essentially of copper or a copper alloy.

The electronic module 1 comprises a VQFN type package in which the lower surface of the die pad 5 and leads 6 are disposed in the bottom outer surface of the plastic housing 4 of the electronic module. These exposed surfaces of the die pad and leads 6 provide the outer contact areas of the package which allow it to be mounted on and, electrically accessed by, the printed circuit board. The electronic module according to the first embodiment of the invention is a surface mountable package.

The electronic module 1 comprises four circuit elements 7 and a control integrated circuit system 8 which, in this embodiment, comprises a PWM (Pulse Width Modulation) chip 38 and a gate driver chip 39. The PWM chip 38 is disposed on the die pad 5 and is positioned in approximately the centre of the die pad 5, and approximately concentric with the outer edges of the die pad 5. One of the four circuit elements 7 is disposed adjacent each of the four sides of the PWM chip 38. The four circuit elements 7 arranged with essentially the same spacing formed their respective side of the PWM chip 38 and symmetrically around the PWM chip 38. Symmetrically is used here to denote that the four circuit elements 7 are disposed an equidistant angle from each other around an axis normal to the upper active surface of the PWM chip 38. Each circuit element 7 is, therefore, arranged at 90° to its adjacent neighbors. The gate driver chip 39 is also mounted on the die pad 5 and is located in a corner region of the die pad 5 which is unoccupied by the circuit elements 7. The gate driver chip 39 is electrically connected to the PWM chip 38 by bond wires 40.

In a further embodiment, not illustrated in the figures, the control integrated circuit system is provided by a single integrated circuit control chip. The single chip may also be positioned in approximately the centre of the upper surface of the die pad and may be arranged in relation to the circuit elements so as to provide a symmetrical arrangement of the circuit elements around the single control chip.

Each circuit element 7 of the electronic module 1 has substantially the same configuration. The detailed description describes a single circuit element 7 which is representative of all four circuit elements 7 for simplicity. The circuit element 7 according to the first embodiment of the invention will be described in conjunction with the cross-sectional view of FIG. 2.

Figure 2:
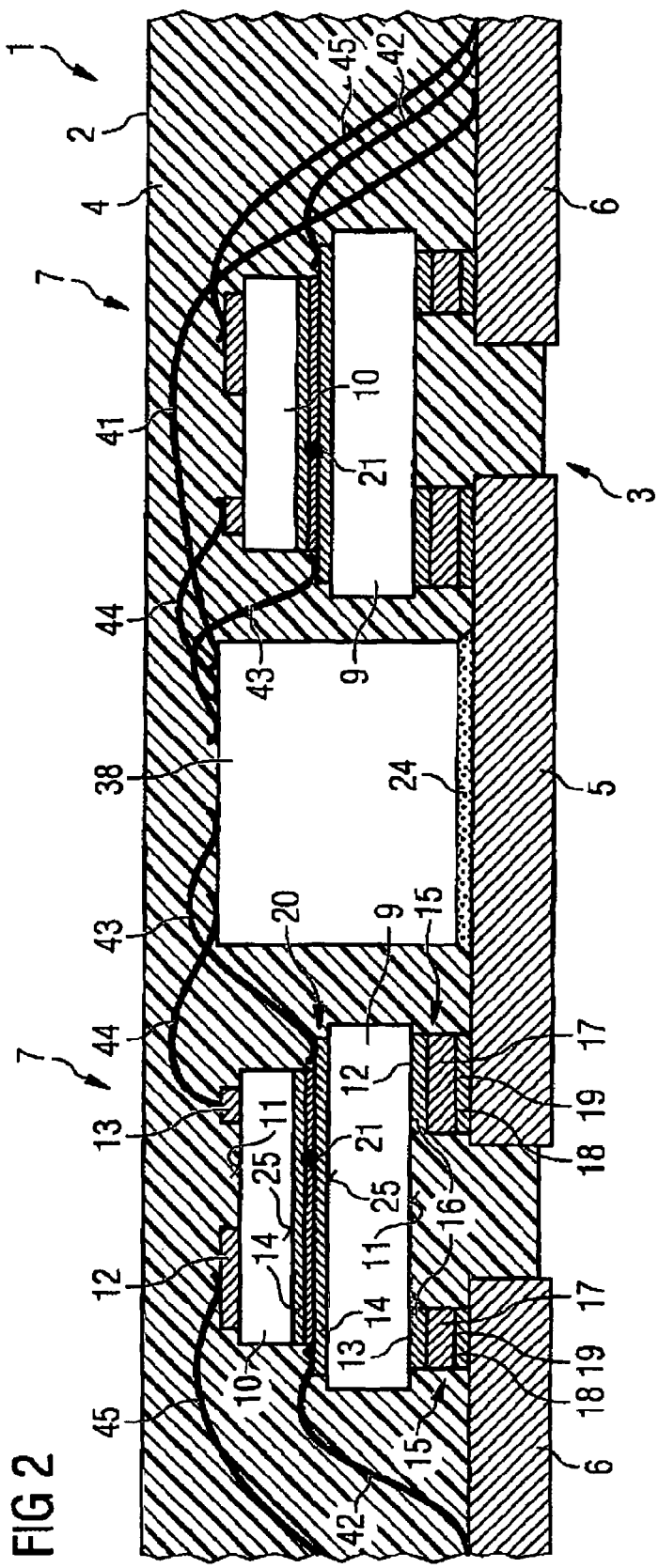
FIG. 2 illustrates a cross-sectional view of the electronic module of FIG. 1.

FIG. 2 illustrates a cross-sectional view of the embodiment of the invention shown in FIG. 1 and shows the control semiconductor chip 8 and the two circuit elements 7 arranged adjacent to opposing sides of the control semiconductor chip 8. The lower surfaces of the die pad 5 and of the leads 6 lie in approximately the same plane and provide the outer contact surfaces of the electronic module 1. The electronic module 1 is, therefore, a surface mountable component.

Each circuit element 7 comprises two vertical power MOSFET devices 9, 10 arranged in a stack. The MOSFET devices 9, 10 of each circuit element 7 are substantially laterally rectangular. The upper MOSFET 10 is positioned on the upper surface of the lower MOSFET 9 substantially concentrically. Each circuit element 7, therefore, has an overall substantially rectangular shape and is arranged with its long side approximately perpendicular to a side of the control semiconductor chip 8 and approximately perpendicular to an edge of the die pad 5. "upper" and "lower" are used in this context to denote the position of the MOSFET in the circuit element 23 with respect to the die pad 5 of the electronic module 22.

In the first embodiment of the invention, the first MOSFET device 9 of the circuit element 7 comprises an n-type conductivity semiconductor material, in this case, n-type silicon and the second MOSFET device 10 of the circuit element 7 comprises a p-type conductivity semiconductor material, in this case, p-type silicon.

Each power MOSFET 9, 10 comprises a first surface 11 which comprises a source electrode 12 and a gate electrode 13, the source electrode 12 and a gate electrode 13 being isolated from one another. Each power MOSFET device 9, 10 also comprises a second surface 25, which is positioned opposing the first surface 11, and which comprises a drain electrode 14 which extends over essentially the entire second surface 25.

The first power MOSFET 9 is arranged with its first surface 11 facing towards the leadframe 3 of the electronic module 1 and forms the lower semiconductor power switch of the stack. The source electrode 12 is positioned above the die pad 5 and the gate electrode 13 is positioned above a leads 6. The source electrode 12 and gate electrode 13 of the first surface 11 of the first MOSFET 9 are mechanically and electrically connected to the die pad 5 and leads 6 respectively by a diffusion solder bond 15. The MOSFET device 9, therefore, extends between the die pad 5 and at least one lead 6 which lies adjacent the die pad 5. The second surface 25 and the drain electrode 14, therefore, face away from the die pad 5 and the first power MOSFET device 9 has a so-called flip-chip arrangement.

The diffusion solder bond 15 comprises three layers. A first layer 16 of aluminium is disposed directly on the first surface 11 of the MOSFET device 9 and provides a low electrical resistance contact to the silicon of the semiconductor device 9. A second layer 17 of essentially pure titanium is positioned directly on the first layer 16 of aluminium and provides a diffusion barrier layer which prevents an undesired reaction between the aluminium of the first layer 16 and the diffusion solder layer 18. The diffusion solder layer 18 comprises a tin-based diffusion solder, such as a silver-tin or a gold-tin diffusion solder, and is disposed directly on the diffusion barrier layer 17. In this embodiment of the invention, the MOSFET device 9 has been mechanically and electrically connected to the lead frame 3 by a diffusion solder process so that the diffusion solder layer 18 comprises intermetallic phases 19 which are formed as a result of the diffusion solder process.

A diffusion solder bond has the advantage that the melting point of the intermetallic phases is higher than the melting point of the diffusion solder itself. Consequently, the bond which is formed as a result of the diffusions process has a melt temperature which is higher than the temperature at which the bond is formed. A diffusion solder bond, therefore, has the advantage that a second semiconductor component may be mounted on the die pad in a subsequent diffusion bonding step without the diffusion solder bond connecting the first semiconductor component to the die pad melting. Similarly, a second device may be mounted on a first device in a subsequent diffusion solder step without the diffusion solder bond connecting the first semiconductor component to the die pad melting.

Diffusion solder bonds are typically thinner than soft solder bonds. Diffusion solder bonds are typically less than 10 µm in thickness which has the advantage that the thermal dissipation from the semiconductor component into the leadframe is improved and the thermal performance of the package is improved.

The drain electrode 14 disposed on the second surface 13 of the first MOSFET device 9 comprises a layer of aluminium which provides a low electrical resistance contact to the silicon body of the MOSFET device 9.

The second MOSFET device 10 comprises p type silicon and, similarly, to the first MOSFET device 9 of the circuit element 7 comprises a first surface 11 with a source electrode 12 and gate electrode 13. The opposing second surface 25 comprises a drain electrode 14.

The second MOSFET device 10 is laterally smaller than the first device 9. The drain contact 14 of the second MOSFET device 10 is disposed on the drain contact 14 of the first MOSFET device 9 and is mechanically and electrically connected to the drain contact 14 of the first MOSFET device 9 by a diffusion solder connection 20. The first MOSFET device 9 and second MOSFET device 10, which comprise a circuit element 7, are electrically connected in series.

Since the second MOSFET device 10 is laterally smaller than the first MOSFET device 9 and since the drain contact 14 of the first MOSFET device 9 substantially covers the rear surface of the second surface 13 of the first MOSFET device 9, the peripheral regions of the drain contact 14 of the first MOSFET device 9 remain uncovered by the second MOSFET device 10. The peripheral regions of the drain electrode 14 of the first MOSFET device 9 are available for electrical connections to be made between the drain contacts 14 of both the first MOSFET device 9 and second MOSFET device 10. The electrical connection provided by the diffusion solder layer 20, therefore, provides a node which provides an output terminal 21 from the circuit element 7.

As previously mentioned, the first MOSFET device 9, which is the lower MOSFET device in the stack forming each circuit element 7, is an n-type MOSFET device. Therefore, the source electrode 12 lies at ground potential and the drain electrode 14 lies at a high potential, for example 12 volts. Due to the arrangement of the circuit element 7, the die pad 5 also lies at ground potential since the source electrode 12 of each of the four MOSFET devices 9 is mounted directly on the die pad 5 by an electrically conducting diffusion solder bond 15.

The upper semiconductor power switch 10 is a p-type device so that the drain electrode 14 lies at ground potential and the source electrode 12 lies at a high potential. The lower semiconductor power switch 9 is, therefore, the low side switch and the upper semiconductor power switch 10 is the high side switch of the circuit element 7. The circuit element 7, therefore, has a half-bridge configuration.

The electronic module 1 also includes electrical connections between the circuit elements 7, die pad 5, leads 6 and semiconductor control system 8. Each plurality of electrical connections performs essentially the same function for each circuit element 7. For simplicity, the electrical connections will be described in the singular for a single circuit element 7. The electrical connections comprise bond wires.

The source electrode 12 of the lower MOSFET device 9 is attached to the upper surface of the die pad 5 by the diffusion solder bond 15 and is, therefore, electrically connected to the die pad 5. The gate electrode 13 on the lower surface 11 of the MOSFET device is electrically connected to a gate lead of the lead frame 3 by a diffusion solder bond 15.

The gate electrode 13 of the first MOSFET device 9 is controlled by the control system 8 by an electrical connection provided by a bond wire 41 which extends from the gate lead 6 on which the gate electrode 13 is electrically connected to the PWM chip 38. The gate lead 6 may comprise a single lead 6 or may comprise two or more leads which are joined together by a support bar which extends between them.

The drain electrode 14 of the first MOSFET device 9 and the drain electrode 14 of the second MOSFET device 10 are electrically connected by a second bond wire 42 which extends from the unoccupied region of the drain contact 14 of the first MOSFET device 9, which provides the node 21 of the circuit element 7, to an output lead 6 of the lead frame 3.

A third bond wire 43 extends between the node 21 of the circuit element 7 and the PWM chip 38. The third bond wire 43 enables the PWM chip 38 to sense the voltage at the node 21.

A fourth bond wire 44 extends between, and electrically connects, the gate electrode 13 of the second MOSFET 10 to the PWM chip 38 and allows the PWM chip 38 to control the gate electrode 13 of the second MOSFET device 10.

A fifth bond wire 45 extends between the source electrode 12 positioned on the first surface 11 of the upper MOSFET device 10 and an input lead 6 of the lead frame 3.

A sixth bond wire 46 extends between the upper active surface of the PWM chip 38 and the upper surface of the die pad 5 in order to provide a ground connection for the upper active surface of the PWM chip 38. A seventh bond wire 50 extends between the PWM chip 38 and a lead 6 of the leadframe 3 and provides a connection for an external power supply to the PWM chip 38.

The electronic module according to the invention has the advantage that the die pad is configured at ground potential and, consequently, can be directly bonded to an external electrically conductive heat dissipater without the functionality of the module being affected. The use of additional electrical isolation on the underside of the die pad can be avoided which reduces the thermal resistance of the package and improves the heat dissipation from the package. The thermal performance of the module is, therefore, improved. The grounded die pad also has the further advantage that the module is easier for the customer to use since the module can be mounted on a printed circuit board without additional electrical isolation between the printed circuit board and the die pad.

The control semiconductor chip 8 is mounted onto the die pad 5 by a thermally conductive layer 24, in this case an adhesive layer which is also electrically conductive. The grounded die pad 5 provides the further advantage that the electrically conductive adhesive 24, such as silver-containing adhesive or a soft solder can be used without disturbing the functionality of the chip. An electrically conductive adhesive has the advantage that the adhesive itself has the good thermal conductivity and, therefore, the heat can be more effectively dissipated from the control semiconductor chip and the reliability of the chip during operation can be improved.

For example, a four phase dc-dc buck converter, in which each phase switches a 2 amp dc current, may generate a maximum power loss of 2 W. This power loss is divided among with devices of the module such that approximately 50% is dissipated from the power MOSFET devices and the 50% from the control semiconductor chip. Therefore, a good thermal connection between the control semiconductor chip and the die pad and, consequently, the environment into which the heat will be dissipated, is advantageous. Since in the electronic module according to the invention, the die pad lies at ground potential, electrically conductive adhesive with improved thermal conductivity can be used as this does not result in a negative impact on the electrical performance of the control semiconductor chip and the electronic module.

The electronic module 1 is assembled by firstly providing a lead frame 3 which includes a die pad 5 and a plurality of leads 6 which surround the die pad 5. The plurality of leads 6 are not physically connected to the die pad 5. The lower surface of each of the leads 6 and lower surface of the die pad 5 are approximately coplanar.

Four first n-type MOSFET devices 9 are provided which each have a first surface 11 which comprises a source electrode 12 and a gate electrode 13. The source electrode 12 and gate electrode 13 are spaced apart from each other and are also not electrically connected to one another. The source electrode 12 and gate electrode 13 comprise a layer of aluminium 16 on which a diffusion barrier layer 17 and an outer diffusion solder layer 18 are arranged. The diffusion solder layer comprises a tin-based diffusion solder. The opposing second side 25 of the first MOSFET device 9 comprises a drain electrode 14.

For second p-type MOSFET devices 10 are provided which each have a first surface 11 which comprises a source electrode 12 and gate electrode 13. The opposing surface 25 of the second MOSFET device 10 comprises the drain electrode 14 on which a diffusion solder layer is arranged.

One of the first MOSFET devices 9 is attached to the lead frame 3 by heating the lead frame 3 to a temperature above the melting point of the diffusion solder layer 18 disposed on the outer surfaces of the source electrode 12 and gate electrode 13 respectively. The first MOSFET device 9 is arranged with its first surface 11 facing the upper surface of the lead frame 3 and is positioned so that the source electrode 12 is located above the die pad 5 and the gate electrode 13 is disposed above a lead 6 of the lead frame 3. The first MOSFET device 9 is then brought into contact with the upper surface of the lead frame 3 under pressure so that intermetallic phases 19 are formed at the interface between the diffusion barrier layer 17 and the upper surface of the die pad 5 and lead 6 respectively. During the diffusion solder process, the intermetallic phases are formed which electrically and mechanically connect the first MOSFET device 9 to the lead frame 3.

This process is repeated for the remaining three first MOSFET devices 9. The four second MOSFET devices 10 are then attached to a respective first MOSFET device 9 to produce for circuit elements 7 by heating the leadframe 3 to a temperature above the melting point of the diffusion solder. Each second MOSFET device 10 is mounted in a separate diffusion solder process. The first MOSFET devices are attached to the leadframe 3 by a diffusion solder bond 15 which has a melting point which is higher than the temperature to which the leadframe 3 is heated. Therefore, the diffusion solder bonds 15 remain mechanically stable and the first MOSFET devices 9 remain attached to the leadframe 3 during the subsequent diffusion solder processes.

The PWM chip 38 and the gate driver chip 39 are then mounted on the upper surface of the die pad 5 by thermally conductive adhesive 24.

The bond wires are then produced to provide the electronic module 1 with the desired electrical circuit. A first plurality of bond wires 41 electrically connects the lead 6 on which the gate electrode 13 of the first MOSFET 9 is mounted to the PWM chip 38. A second plurality of bond wires 42 is produced which extends between the and occupied area of the drain electrode 14 of the first MOSFET device 9, and, therefore, the node 21 of each of the circuit elements 7, and a lead 6. A plurality of bond wires 43 are produced between the PWM chip 38 and the node 21 of each circuit element 7 which allow the PWM chip 38 to sense the voltage at the note 21. A plurality of bond wires 44 are then produced between the gate electrode 13 of the second MOSFET device 10 and the PWM chip 38. A further plurality of bond wires 45 are then produced which extend between, and electrically connect, the source electrode 12 of each second MOSFET device 10 and a lead 6 of the leadframe 3. Bond wires 40 are also produced between the PWM chip 38 and the gate driver chip 39. And at least one bond wire 46 is produced between the active upper surface of the PWM chip 38 and die pad 5 to provide a ground connection for the upper active surface of the PWM chip 38.

In an alternative process, after the four first MOSFET devices 9 are mounted onto the leadframe 3, the bond wires 42 between and the drain contact 14 on the second surface 25 of the first MOSFET devices 9 and the respective leads 6 are produced. The bond wires 43 between the drain electrode 14 of the first MOSFET devices 9 and the PWM chip 38 are produced.

The four second MOSFET devices 10 are then mounted on the respective drain electrode 14 of the first MOSFET devices 9 and a second bond wire process carried out to electrically connect the gate electrode 13 to the PWM chip 38 and the source electrode 12 to the lead 6 of the leadframe 3.

After all of the electrical connections have been made, the electronic module 1 undergoes a transfer moulding process in which the upper surface of the lead frame 3, integrated circuit control system 8, circuit elements 7, and the pluralities of bond wires (40, 41, 42, 43, 44, 45, 46, 50) are encapsulated in plastic encapsulation material 4. The outer surfaces of the plastic encapsulation material 4 provide the outer surfaces 2 of the electronic component 1. The lower surfaces of the die pad 5 and lead 6 remain free from the plastic encapsulation compound 4 and provide the outer contact surfaces of the electronic module 1.

The invention also provides further alternative circuit elements, each comprising two power MOSFET devices in a half bridge configuration. The power MOSFET devices of each circuit element have a configuration such that the die pad of the electronic module lies at ground potential.

Figure 3:
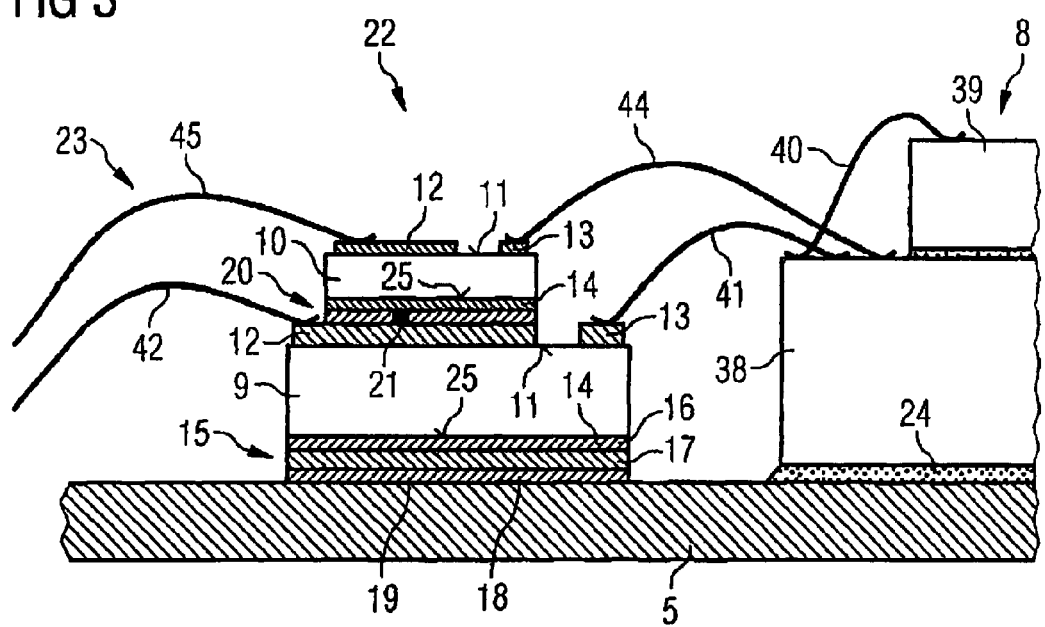
FIG. 3 illustrates a cross-sectional view of a portion of an electronic module according to a second embodiment of the invention.

FIG. 3 illustrates a cross-sectional view of a portion of an electronic module 22 comprising a control semiconductor chip 8 and two circuit elements 23 according to a second embodiment of the invention. The two circuit elements 23 are substantially identical and only one circuit element 23 is shown in the Figure for clarity.

Features of the second embodiment of the invention shown in FIG. 3 which are essentially the same as the embodiment of FIG. 1 or perform a similar function are denoted with the same reference number and are not necessarily described in detail again.

Each circuit element 23 comprises two vertical MOSFET devices 9, 10 as semiconductor power switches. Each MOSFET device 9, 10 has a first surface 11 with a source electrode 12 and a gate electrode 13 and a second surface 25 with a drain electrode 14. In contrast to the embodiment of FIGS. 1 and 2, both the first MOSFET device 9 and the second MOSFET device 10 are a p-type semiconductor devices. Therefore, the drain electrode 14 of both the first MOSFET device 9 and the second MOSFET device 10 lies at ground potential, i.e. 0V and the source electrode 12 lies at a high potential.

The two MOSFET devices 9, 10 of the circuit element 23 are arranged in a vertical stack in which the first MOSFET device 9 is the lower MOSFET device and the second MOSFET device 10 is disposed on the first MOSFET device 9 and is the upper MOSFET device.

The first or lower MOSFET device 9 is disposed on the upper surface of the die pad 5 by a diffusion solder bond 15 which mechanically and electrically connects the drain electrode 14 to the upper surface of the die pad 5. The first surface 11 of the lower MOSFET device 9, therefore, faces away from the die pad 5 in the second embodiment of the invention in contrast to the first embodiment of the invention, illustrated with FIGS. 1 and 2, in which the first surface 11 of the lower MOSFET 9 faces towards the die pad 5. In contrast to the embodiment of FIGS. 1 and 2, the entire MOSFET device 9 is positioned within the boundaries of the die pad 5.

The diffusion solder bond 15 consists of three layers 16, 17 and 18 and is essentially the same as that described in conjunction with FIG. 1.

In a further embodiment not shown in the diagrams, the first MOSFET device 9 is mounted on the die pad 5 by a diffusion solder bond which consists of two layers. A first layer of titanium is disposed directly on the silicon body of the MOSFET device 9 and provides an ohmic contact to the silicon. This first layer of titanium also has the function of a diffusion barrier layer. A second layer consisting of a diffusion solder is disposed directly on the first titanium layer. The first MOSFET device 9 is mechanically and electrically attached to the upper surface of the die pad 5 by a diffusion solder process so that intermetallic phases form from the diffusion solder layer and the elements of the contiguous surface, in this case the die pad 5.

In the circuit element 23, shown in FIG. 3, the second MOSFET device 10 is laterally smaller than the lateral dimensions of the source electrode 12 positioned on the first surface 11 of the first MOSFET device 9. The second MOSFET device 10 is disposed on the source electrode 12 of the first MOSFET device 9 so that at least one peripheral region of the source electrode 12 remains uncovered by the second MOSFET device 10 and is freely accessible. This freely accessible region provides a contact area onto which a contact element, for example a bond wire, can be attached.

The drain electrode 14 of the second MOSFET device 10 is disposed on, and electrically connected, to the source electrode 12 of the first MOSFET device 9 by a electrically conductive diffusion solder bond 20. This joint or connection provides a node 21 for an output terminal of the circuit element 23. The freely accessible region of the source electrode 12 of the first MOSFET device 9, therefore, allows the node 21 of the circuit element 23 to be electrically accessed.

The first surface 11 of the second MOSFET device 10 including the source electrode 12 and gate electrode 13 of the second MOSFET device 10, therefore, faces upwards away from the die pad 5.

The electronic module 23 also includes electrical connections between the first MOSFET device 9, second MOSFET device 10, PWM chip 38, leads 6 and die pad 5 of the leadframe 3 essentially as shown in FIGS. 1 and 2.

In this embodiment of the invention, the integrated circuit control system 8 includes a PWM chip 38 and a data driver chip 39. In contrast to the embodiment shown in FIGS. 1 and 2, the data driver chip 39 is mounted on the upper surface of the PWM chip 38. This arrangement has the advantage that the integrated circuit control system 8 occupies less space on the die pad 5.

In the second embodiment of the invention, both the first MOSFET device 9 and second MOSFET device 10 exhibit p-type conductivity and, therefore, the drain electrode 14 lies at ground potential and the source electrode 12 lies at the high potential, for example 12V. The first or lower MOSFET device 9 in the stack, which provides a circuit element 23, is the low side switch and the second upper MOSFET device 10 is the high side switch of a half bridge configuration. The circuit element 23, therefore, provides a half bridge circuit which is mounted directly on the die pad 5 which enables the die pad 5 to lie at ground potential or 0 volts.

Figure 4:
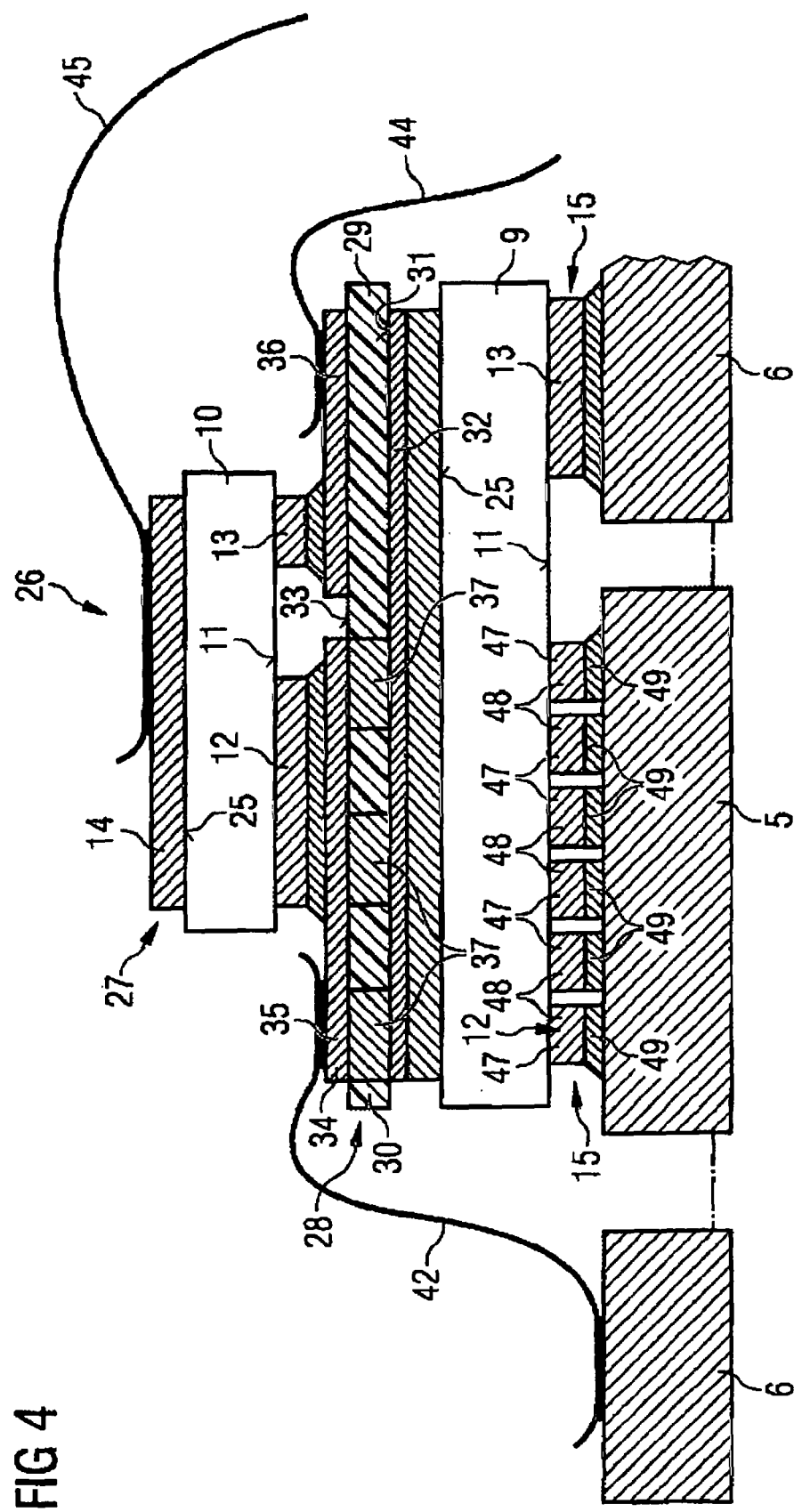
FIG. 4 illustrates a cross-sectional view of a portion of an electronic module according to a third embodiment of the invention.

FIG. 4 shows an electronic module 26 including two circuit elements 27 according to a third embodiment of the invention. The electronic module 26 does not include a control integrated circuit within the electronic module 26. In the cross-sectional view of the electronic module 26 shown in FIG. 4, only one circuit element 27 of four circuit elements 27 present in the module 26 is illustrated for clarity.

Similarly to the embodiment is shown in FIGS. 1 to 3, features which are essentially the same or perform essentially the same function as features described in conjunction with FIGS. 1 to 3 are denoted by the same reference number and are not necessarily described in detail again. In this embodiment of the invention, the circuit element 27 also contains two MOSFET devices 9,10 as semiconductor power switches. In this third embodiment, both of the MOSFET devices 9, 10 are of n-type conductivity. Each MOSFET device 9, 10 is a vertical transistor a device with a first surface 11 which comprises a source electrode 12 and a gate electrode 13 and a second surface 25 which opposes the first surface 11 on which a drain electrode 14 is positioned.

As previously discussed, in a vertical n-type MOSFET device the source electrode 12 lies at ground potential, that is 0 volts and the drain electrode 14 lies at the high potential, for example, 12 volts.

In accordance with the invention, therefore, the first MOSFET device 9 is mounted on the die pad 5 with a flip chip type arrangement so that the source electrode 12 faces the upper surface of the die pad 5. This source electrode 12 is electrically and mechanically connected to the upper surface of the die pad 5 by a solder bond 15.

In the third embodiment of the invention, the source electrode 12 comprises a plurality of physically isolated contact bumps 47. The plurality of physically isolated contact bumps 47 are arranged in a regular array of rows and columns (not seen in the cross-sectional view of FIG. 4). The outer surface of each of the contact bumps 47 comprises a diffusion solder bond 15. In this embodiment of the invention, therefore, the electrical connection between the first surface 11 of the lower MOSFET chip 9 and the die pad 5 is provided by a plurality of contact bumps 47, each comprising a titanium layer 48 which is disposed directly on the first surface 11 and a tin based diffusion solder layer 49 disposed directly between the titanium layer 48 and the upper surface of the die pad 5. The diffusion solder layer 49 comprises intermetallic phases formed during the diffusion solder process.

The provision of a source electrode 12 in the form of a plurality of contact bumps 47 provides an improved mechanical connection between the circuit element 27 and the die pad 5.

Similarly to the embodiment of FIG. 1, the lower MOSFET device 9 extends over the side edge of the die pad 5 so that the gate electrode 13 is positioned above a lead 6 positioned adjacent the die pad 5. The gate electrode 13 is mechanically and electrically connected to the lead 6 by a diffusion solder bond 15 which is essentially the same as the diffusion bond 15 which mechanically and electrically connects the source electrode 12 to the die pad 5. The drain electrode 14 positioned on the opposing second side 25 of the MOSFET device 9, therefore, faces upwards away from the upper surface of the die pad 5. The MOSFET device 9 provides the low side switch of a half bridge configuration.

The second MOSFET device 10 is disposed on the first MOSFET device 9 to provide a circuit element 27 according to a third embodiment of the invention. In this third embodiment of the invention, however, the second MOSFET device 10 is also an n-type MOSFET device in which the source electrode 12 lies at ground potential and the drain electrode 14 lies as a high potential. Therefore, the second MOSFET device 10 is also configured with a flip chip type arrangement with the first surface 11 including the source electrode 12 and gate electrode 13 facing downwards towards the drain electrode 14 of the first semiconductor switch 9 and towards the upper surface of the die pad 5.

In order to provide a half bridge arrangement in which the source electrode 12 of the second MOSFET device 10 is electrically connected in a series with the drain electrode 14 of the first MOSFET device 9 and in which in the gate electrode 13 of the second MOSFET device 10 is electrically isolated from the first MOSFET device 9, a rewiring structure or interposer 28 is provided between the first MOSFET device 9 and second MOSFET device 10 of the circuit element 27. The rewiring structure 28 overall has a lateral extent which substantially corresponds to lateral dimensions of the first MOSFET device 9. The rewiring structure 28, therefore, extends beyond the footprint of the upper MOSFET device 10.

The rewiring structure 28 comprises an electrically insulating core layer 29 comprising a dielectric 30. The dielectric may be provided by a polymer film such as a polyimide. An electrically conductive layer 32 which substantially covers the lower surface of the insulation layer 29 is disposed directly between the lower surface 31 of the dielectric core layer 29 and the drain contact 14 of the first MOSFET device 9.

A structured conductive layer 34 is disposed on the opposing upper surface 33 of the insulation layer 29 and comprises two regions 35, 36 which are electrically isolated from each other. The source electrode 12 of the second MOSFET device 10 is attached, and electrically connected to, the first region 35 and the gate electrode 13 of the second MOSFET device 10 is attached to, and electrically connected to, the second regions 26 of the structured layer 34. The regions 35, 36 are positioned so as to correspond to the position of the source electrode 12 and gate electrode 13 of the second MOSFET device 10.

The regions 35, 36 extend beyond the footprint of the source electrode 12 and gate electrode 13 respectively so that each regions is laterally larger than the electrode of the second MOSFET device 10 to which it is connected. Each region 35, 36, therefore, has a portion which extends beyond the lateral extent of the second MOSFET device 10 to which a contacting element such as a bond wire can be attached. This enables the source electrode 12 and gate electrode 13 of the upper second MOSFET device 10 to be electrically independently accessed by a control IC and/or via the leadframe 3 of the electronic module 26.

The drain electrode 14 of the lower MOSFET device 9 is electrically connected to the source electrode 12 of the upper MOSFET device 10 by one or more through contacts 37 which extend through the thickness of the insulation layer 29 of the interposer 28. Since the gate electrode 13 of the upper MOSFET device 10 should remain electrically isolated from the lower MOSFET device 9, no through contacts are provided between the first electrically conductive layer 32 positioned on the first surface 31 of the insulation layer 29 and the region 36 positioned on the upper surface 33 of the dielectric core which provides the rear of the wiring structure for the gate electrode 13.

The first MOSFET device 9 and second MOSFET device 10 are therefore, electrically connected in a series and the electrical connection between the drain electrode 14 of the first MOSFET device 10 and the source electrode of the second MOSFET device 10 provided by the first region 36, through contacts 37 and first conductive layer 32 provides a node 21 for an output terminal.

In further embodiment which are not shown in the figures, an electronic module according to the invention may include circuit elements which differ in the conductivity type and orientation of the two semiconductor power switches which provide the circuit element. However, the circuit elements are configured such that the electrode which is disposed on, and electrically connected, to the die pad of the electronic module lies at ground potential so that the die pad lies at ground potential.

In further embodiments of the invention not illustrated in the figures, the electronic module comprises two or more control integrated circuits and may also comprise further circuit elements such as inductors and capacitors depending on the output required by the dc-dc buck converter.

The invention is also not limited to a VQFN-type package and may be advantageously used in any package in which the rear side of the die pad is exposed and, therefore, uncovered by the plastic housing of the package.

REFERENCE NUMBERS 1 first electronic module
2 package
3 leadframe
4 plastic encapsulation
5 die pad
6 lead
7 circuit element
8 control semiconductor integrated circuit system
9 first MOSFET
10 second MOSFET
11 first surface of MOSFET
12 source electrode
13 gate electrode
14 drain electrode
15 diffusion solder bond
16 contact layer
17 diffusion barrier layer
18 diffusion solder layer
19 intermetallic phases
20 diffusion solder connection
21 node
22 second electronic module
23 second circuit element
24 thermally conductive layer
25 second surface of MOSFET
26 third electronic module
27 third circuit element
28 rewiring structure
29 insulation layer
30 dielectric
31 first surface of insulation layer
32 first electrically conductive layer
33 second surface of core layer
34 structured conductive layer
35 first region of structured conductive layer
36 second region of structured conductive layer
37 through contacts
38 PWM chip
39 gate driver chip
40 bond wire
41 first bond wire
42 second bond wire
43 third bond wire
44 fourth bond wire
45 fifth bond wire
46 sixth bond wire
47 contact bump
48 contact layer of contact bump
49 diffusion bond of contact bump
50 seventh bond wire

What is claimed is:

1. An electronic module, comprising:
   a heat sink comprising an upper surface and a lower surface, wherein the lower surface provides an outer contact area of the electronic module;
   a plurality of leads arranged adjacent the heat sink;
   at least one control semiconductor chip mounted on the upper surface of the heat sink,
   at least one circuit element, wherein each circuit element comprises two vertical semiconductor power switches arranged in a stack and configured to provide a half-bridge circuit, wherein
      a first vertical semiconductor power switch is a n-type semiconductor power switch having a first surface comprising at least one anode and at least one control electrode and having a second surface comprising at least one cathode, and wherein
      a second vertical semiconductor power switch is a p-type semiconductor power switch having a first surface comprising at least one cathode and at least one control electrode and having a second surface comprising at least one anode;
   wherein the anode of the second vertical semiconductor power switch is mounted on the cathode of the first vertical semiconductor power switch by a first electrically conductive layer, the first electrically conductive layer providing a node defining an output, and
   wherein the anode of the first vertical semiconductor power switch of each of the circuit elements is mounted on the upper surface of the heat sink by a second electrically conductive layer, the lower surface of the heat sink providing the ground contact area of the electronic module, and wherein
   the control electrode of the first vertical semiconductor power switch and the control electrode of the second vertical semiconductor power switch of each circuit element are electrically connected to, and controllable by, the control semiconductor chips, and wherein,
   the node is electrically connected to an output lead and the cathode of the second vertical semiconductor power switch is electrically connected to an input lead.

2. An electronic module according to claim 1, wherein the control electrode of the first vertical semiconductor power switch is mounted on a control lead by a third electrically conductive layer.

3. An electronic module according to claim 1, wherein the first vertical semiconductor power switch is one of a MOSFET and a IGBT and the second vertical semiconductor power switch is one of a MOSFET and a IGBT.

4. An electronic module according to claim 1, the electronic module comprises two control semiconductor chips, a first semiconductor control chip being a control electrode driver and a second semiconductor control chip being a pulse width modulator.

5. An electronic module according to claim 4, wherein each of the two semiconductor control chips is mounted directly on the heat sink.

6. An electronic module according to claim 4, wherein the control electrode driver chip is mounted on the pulse wave modulator chip, the pulse wave modulator chip being mounted on the heat sink.

7. An electronic module according to claim 1, wherein the electronic module comprises at least two circuit elements, each mounted on the heat sink, and the at least two circuit elements are arranged at substantially the same distance from the control semiconductor chip.

8. An electronic module according to claim 7, wherein the at least two circuit elements are arranged symmetrically around the control semiconductor chip.

9. An electronic module according to claim 1, wherein the electronic module is configured as a dc-dc buck converter.

10. An electronic module according to claim 1, wherein the first electrically conductive layer comprises a diffusion solder bond and the second electrically conductive layer comprises a diffusion solder bond.

11. An electronic module, comprising:
a heat sink comprising an upper surface and a lower surface, wherein the lower surface provides an outer contact area of the electronic module;
a plurality of leads arranged adjacent the heat sink;
at least one control semiconductor chip mounted on the upper surface of the heat sink,
at least one circuit element, wherein each circuit element comprises two vertical semiconductor power switches arranged in a stack and configured to provide a half-bridge circuit, wherein
a first vertical semiconductor power switch is a n-type semiconductor power switch having a first surface comprising at least one anode and at least one control electrode and having a second surface comprising at least one cathode, and wherein
a second vertical semiconductor power switch is a n-type semiconductor power switch having a first surface comprising at least one anode and at least one control electrode and having a second surface comprising at least one cathode;
wherein the anode of the second vertical semiconductor power switch is mounted on the cathode of the first vertical semiconductor power switch by a first electrically conductive layer, the first electrically conductive layer providing a node defining an output, and
wherein the anode of the first vertical semiconductor power switch of each of the circuit elements is mounted on the upper surface of the heat sink by a second electrically conductive layer, the lower surface of the heat sink providing the ground contact area of the electronic module, and wherein
the control electrode of the first vertical semiconductor power switch and the control electrode of the second vertical semiconductor power switch of each circuit element are electrically connected to, and controllable by, the control semiconductor chip, and wherein,
the node is electrically connected to an output lead and the cathode of the second vertical semiconductor power switch is electrically connected to an input lead,
wherein the electronic module comprises two control semiconductor chips, a first vertical semiconductor control chip being a control electrode driver and a second vertical semiconductor control chip being a pulse width modulator, wherein the control electrode driver chip is mounted on the pulse wave modulator chip, the pulse wave modulator chip being mounted on the heat sink.

12. An electronic module according to claim 11, wherein the control electrode of the first vertical semiconductor power switch is mounted on a control lead by a third electrically conductive layer.

13. An electronic module according to claim 11, wherein each circuit element further comprises a rewiring structure disposed between, and electrically connecting, the cathode of the first vertical semiconductor power switch and the anode of the second vertical semiconductor power switch, and wherein the control electrode of the second vertical semiconductor power switch is electrically isolated from the first vertical semiconductor power switch.

14. An electronic module according to claim 11, wherein the first vertical semiconductor power switch is one of a MOSFET and an IGBT and the second vertical semiconductor power switch is one of a MOSFET and an IGBT.

15. An electronic module according to claim 11, wherein the electronic module comprises at least two circuit elements, each mounted on the heat sink, wherein the at least two circuit elements are arranged at substantially the same distance from the control semiconductor chip.

16. An electronic module according to claim 15, wherein the at least two circuit elements are arranged symmetrically around the control semiconductor chip.

17. An electronic module according to claim 11, wherein the electronic module is configured as a dc-dc buck converter.

18. An electronic module according to claim 11, wherein the first electrically conductive layer comprises a diffusion solder bond and the second electrically conductive layer comprises a diffusion solder bond.

19. An electronic module, comprising:
a heat sink comprising an upper surface and a lower surface, wherein the lower surface provides an outer contact area of the electronic module;
a plurality of leads arranged adjacent the heat sink;
at least one control semiconductor chip mounted on the upper surface of the heat sink,
at least one circuit element, wherein each circuit element comprises two vertical semiconductor power switches arranged in a stack and configured to provide a half-bridge circuit, wherein
a first vertical semiconductor power switch is a p-type semiconductor power switch having a first surface comprising at least one cathode and at least one control electrode and having a second surface comprising at least one anode, and wherein
a second vertical semiconductor power switch is a p-type semiconductor power switch having a first surface comprising at least one cathode and at least one control electrode and having a second surface comprising at least one anode;
wherein the anode of the second vertical semiconductor power switch is mounted on the cathode of the first vertical semiconductor power switch by a first electrically conductive layer, the first electrically conductive layer providing a node defining an output, and
wherein the anode of the first vertical semiconductor power switch of each of the circuit elements is mounted on the upper surface of the heat sink by a second electrically conductive layer, the lower surface of the heat sink providing the ground contact area of the electronic module, and wherein
the control electrode of the first vertical semiconductor power switch and the control electrode of the second vertical semiconductor power switch of each circuit element are electrically connected to, and controllable by, the control semiconductor chip, and wherein, the node is electrically connected to an output lead and the cathode of the second vertical semiconductor power switch is electrically connected to an input lead, wherein the electronic module comprises two control semiconductor chips, a first vertical semiconductor control chip being a control electrode driver and a second vertical semiconductor control chip being a pulse width modulator, and wherein the control electrode driver chip is mounted on the pulse wave modulator chip, the pulse wave modulator chip being mounted on the heat sink.

20. An electronic module according to claim 19, wherein the first vertical semiconductor power switch is one of a MOSFET and a IGBT and the second vertical semiconductor power switch is one of a MOSFET and a IGBT.

21. An electronic module according to claim 19, wherein the electronic module comprises at least two circuit elements which are mounted on the heat sink and arranged at substantially the same distance from the control semiconductor chip.

22. An electronic module according to claim 21, wherein the at least two circuit elements are arranged symmetrically around the control semiconductor chip.

23. An electronic module according to claim 19, wherein the electronic module is configured as dc-dc buck converter.

24. An electronic module according to claim 19, wherein the first electrically conductive layer comprises a diffusion solder bond and the second electrically conductive layer comprises a diffusion solder bond.

* * * * *

UNITED STATES PATENT AND TRADEMARK OFFICE
CERTIFICATE OF CORRECTION

PATENT NO. : 7,291,869 B2
APPLICATION NO. : 11/348221
DATED : November 6, 2007
INVENTOR(S) : Ralf Otremba It is certified that error appears in the above-identified patent and that said Letters Patent is hereby corrected as shown below:

On the Title Page, Section (75) Inventor:
　　Please delete "Kaufeuren" and insert --Kaufbeuren--

On the Title page, Section (73) Assignee:
　　Please delete "Infieon" and insert --Infineon--

Signed and Sealed this

Twelfth Day of August, 2008

JON W. DUDAS
*Director of the United States Patent and Trademark Office*